(12) United States Patent
Kaewell, Jr.

(10) Patent No.: US 6,256,339 B1
(45) Date of Patent: *Jul. 3, 2001

(54) MULTICHANNEL VITERBI DECODER

(75) Inventor: John D. Kaewell, Jr., Jamison, PA (US)

(73) Assignee: InterDigital Technology Corporation, Wilmington, DE (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/432,038

(22) Filed: Nov. 1, 1999

Related U.S. Application Data

(63) Continuation of application No. 08/871,008, filed on Jun. 6, 1997, now Pat. No. 6,005,898.
(60) Provisional application No. 60/040,477, filed on Mar. 12, 1997.

(51) Int. Cl.[7] .............................. H04K 1/00; H04L 23/00
(52) U.S. Cl. ........................................ 375/147; 375/377
(58) Field of Search ................................... 375/377, 130, 375/340, 341, 147, 329, 332, 279, 280, 281, 262; 370/342, 335, 320; 455/522

(56) References Cited

U.S. PATENT DOCUMENTS

| | | | |
|---|---|---|---|
| 5,103,459 | * 4/1992 | Gilhousen et al. | 375/130 |
| 5,173,926 | 12/1992 | Iwasaki | 375/17 |
| 5,280,537 | 1/1994 | Sugiyama et al. | 375/1 |
| 5,396,516 | * 3/1995 | Padovani et al. | 375/225 |
| 5,454,009 | 9/1995 | Fruit et al. | 375/202 |
| 5,465,269 | * 11/1995 | Schaffner et al. | 375/146 |
| 5,504,773 | * 4/1996 | Padovani et al. | 375/130 |
| 5,528,593 | * 6/1996 | English et al. | 455/522 |
| 5,535,239 | * 7/1996 | Padovani et al. | 375/130 |
| 5,559,757 | 9/1996 | Catipovic et al. | 367/134 |
| 5,566,206 | 10/1996 | Butler et al. | 375/225 |
| 5,581,575 | 12/1996 | Zehavi et al. | 375/200 |
| 5,596,607 | 1/1997 | Larsson et al. | 375/340 |
| 5,619,524 | * 4/1997 | Ling et al. | 375/377 |
| 5,710,784 | * 1/1998 | Kindred et al. | 375/262 |
| 6,035,209 | * 3/2000 | Tiedemann, Jr. et al. | 455/522 |

FOREIGN PATENT DOCUMENTS

| | | |
|---|---|---|
| 0712219 | 5/1996 | (EP) . |
| 9508888 | 3/1995 | (WO) . |

OTHER PUBLICATIONS

Hinderling J.K.: "CDMA Mobile Station Modem ASIC"; Mar. 1, 1993, IEEE Journal of Solid–State Circuits, vol. 28, No. 3, pp. 253–260, see abstract, see p. 255, right–hand column, parag. 3 and 4.

Cohen E. et al.: "Multi–rate detection for the IS–95A CDMA forward traffic channels using the 13 kbps speech coder"; 1996; IEEE International Conference on Communications. Converging Technologies For Tomorrow's Application, ICC '9. Conference Record (Cat. No. 96CH35916), Proceedings of ICC/Supercomm '96—International Conference on Communications, Dallas TX, USA, 1996, ISBN 0–7803–3250–4, New York, NY, USA, pp. 1844–1848, vol. 3.

Czaja S. et al.: "Variable data rate Viterbi decoder with modified LOVA algorithm"; 1995 IEEE Tencon. IEEE Region 10 International Conference on Microelectronics and VLSI. "Asia–Pacific Microelectronics 200". Proceedings (Cat. No. 95CH35787), 1995 IEEE Tencon. Region 10 International Conference on Microelectronics and VLSI. AS, 1995, ISBN 07803–02624–5, New York, NY, USA, IEEE, USA; pp. 472–475.

\* cited by examiner

*Primary Examiner*—Tesfaldet Bocure
(74) *Attorney, Agent, or Firm*—Volpe & Koenig, P.C.

(57) ABSTRACT

A communication system where the data rate of a given transmission has been encoded by a transmitter and is then used to adjust a plurality of convolutional decoders sharing common memory. The system uses common processing resources to provide up to four discrete channels having multi-rate convolutional error correction decoding resulting in a reduced silicon area and low power operation. The system is capable of supporting data communication at 8 kbps up to 64 kbps for high rate ISDN communication in receivers of both base station and consumer unit locations.

16 Claims, 15 Drawing Sheets

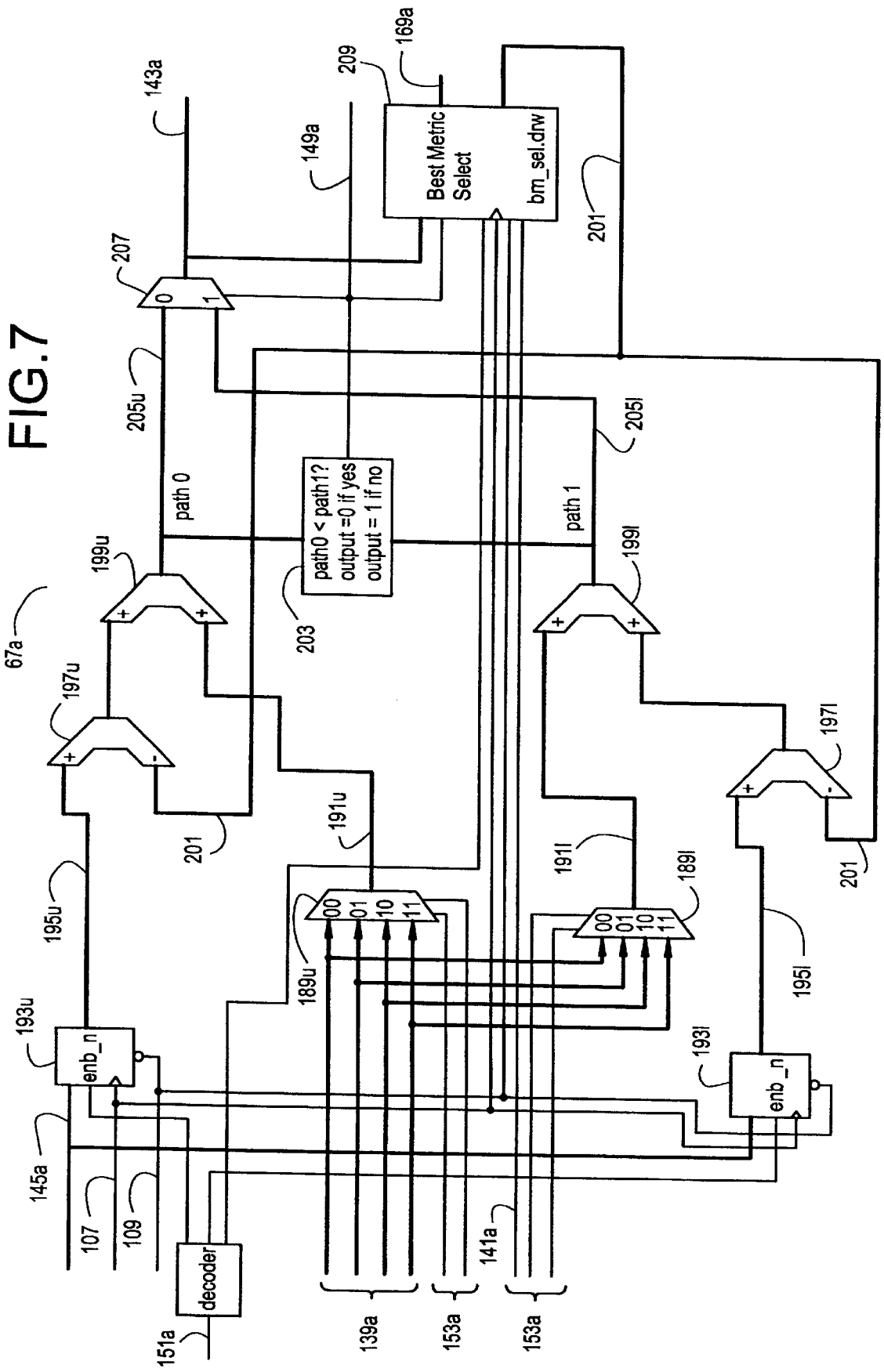

MULTICHANNEL VITERBI DECODER

This is a continuation of application Ser. No. 08/871,008, filed Jun. 6, 1997, now issued as U.S. Pat. No. 6,005,898, on Dec. 21, 1999, which is a continuation-in-part of U.S. Provisional Application Ser. No. 60/040,477, filed Mar. 12, 1997.

BACKGROUND OF THE INVENTION

1. Field of the Invention

The present invention relates generally to digital communications. More specifically, the invention relates to a system in which data at a variable rate is transmitted and is received at a communications receiver where the variable rate data is decoded in an efficient, multichannel, multi-rate data decoder.

2. Description of the Prior Art

The most advanced communication technology today makes use of spread spectrum modulation or code divisional multiple access (CDMA) for point-to-multipoint telecommunications. Since the 1950's, CDMA has been used in military applications due to the difficulty in detecting and jamming the communications transmission. This attribute is due to a wireless communication technique that uses a modulated transmission bandwidth much greater than the information bandwidth of the transmitted signal.

A simplified CDMA communication scheme is shown in FIG. 1. A single communication channel of a given bandwidth is mixed with a spreading code. The relatively narrow band modulated signal is spread by sequence to occupy a much wider transmitted bandwidth by multiplication with a unique spreading code. The spreading code comprises a noise-like high-rate pseudorandom sequence or code that becomes part of the transmitted data. The low level noise-like appearance of the resultant transmitted signal is such that it is unlikely to interfere with other spectrum users.

At the receiver, the signal is despread by correlating the received broadband signal with an identical locally generated pseudorandom sequence to resolve the data from a plurality of data signals occupying the same transmission bandwidth. This collapses the signal back to its original bandwidth and also spreads any narrow band radio signals present within the occupied spectrum so that they now appear as noise to the receiver. By using many different pseudorandom code sequences, multiple users may be accommodated within the same transmission spectrum.

The same features that have enabled CDMA communication techniques to succeed in military applications also make CDMA communication systems, particularly Broadband Code Division Multiple Access™ or B-CDMA™ systems, compelling for efficient use of the crowded commercial radio frequency spectrum. Among the many attributes of the CDMA system is the virtual unlimited capacity of the system. Since each user in a CDMA communication system transmits and receives signals over the same transmission bandwidth, there are less stringent channelization and guardband requirements. Unlike FDMA and TDMA systems where the capacity is limited by the number of discrete channels, the capacity for CDMA systems is limited by interference. Therefore, the number of users able to communicate simultaneously over that given transmission bandwidth is significantly increased.

In addition to voice information, non-voice information alone or a combination of the two may be transmitted to the receiver. Certain communications standards such as the integrated services digital network (ISDN) require a much greater data rate than that of digitized voice. To optimize the communication system, various data rates are transmitted to increase the signal-to-noise ratio (SNR) to all receivers.

One measure of spread-spectrum performance is the system process gain, $G_p$, which is determined by the ratio of channel bit rate to information bit rate, $R_c/R_i$. The input and output signal to noise ratios are related as $$\frac{S}{N_o} = G_p \left(\frac{S}{N_o}\right)_i. \qquad \text{Equation 1}$$

It can be seen that the higher the data rate, the more interference is produced and the signal-to-noise ratio will suffer. The reduction of interference directly translates to a capacity increase.

Most CDMA telecommunications systems transmit variable rate data to keep the SNR as great as possible. To achieve this, the transmission data rate is either identified within the system level control message which is part of the signal channel or a given receiver must be able to detect the transmitted data rate.

Since many users share this same spectral transmission channel, interference can be induced from one user to another when there is not enough code isolation between the users. Moreover, the data rate must be known prior to convolutional error correction decoding in either the transmitter or receiver.

Most prior art receivers make use of independent, single-rate convolution decoders to properly reconstruct the digital data once received and despread. Since data rate information for each frame is transmitted, the receiver does not have to determine from the received frame of data the rate at which the data was encoded thereby lessening the complexity of the receiver and increasing overall system speed. However, the use of convolutional decoders dedicated to each transmitted data rate reduces overall processing efficiency and increases system costs.

Accordingly, there exists a need for an efficient, convolutional decoder that can handle variable data rates.

SUMMARY OF THE INVENTION

The present invention relates to a communication system where the data rate of a given transmission has been encoded by a transmitter and is then used to adjust a plurality of convolutional decoders sharing common memory. The system uses common processing resources to provide up to four discrete channels having multi-rate convolutional error correction decoding resulting in a reduced silicon area and low power operation. The system is capable of supporting voice communication at 8 kbps up to 64 kbps for high rate ISDN communication. Although the present invention may be used in a variety of communication systems, the preferred communication systems include mobile telephone, PCS, wireless local-loop and CDMA communication. The present invention may be used in the receivers of both the base station and consumer unit locations.

Accordingly, it is an object of the present invention to provide an efficient multi-rate convolutional decoder for multichannel applications.

It is the further object of the invention to provide a multichannel convolutional decoder architecture of reduced complexity and increased performance.

Other objects and advantages of the system and method will become apparent to those skilled in the art after reading the detailed description of the preferred embodiment.

BRIEF DESCRIPTION OF THE DRAWINGS

FIG. 7 is a detailed block diagram of one add-compare-select channel.

DETAILED DESCRIPTION OF THE PREFERRED EMBODIMENT

Figure 1:
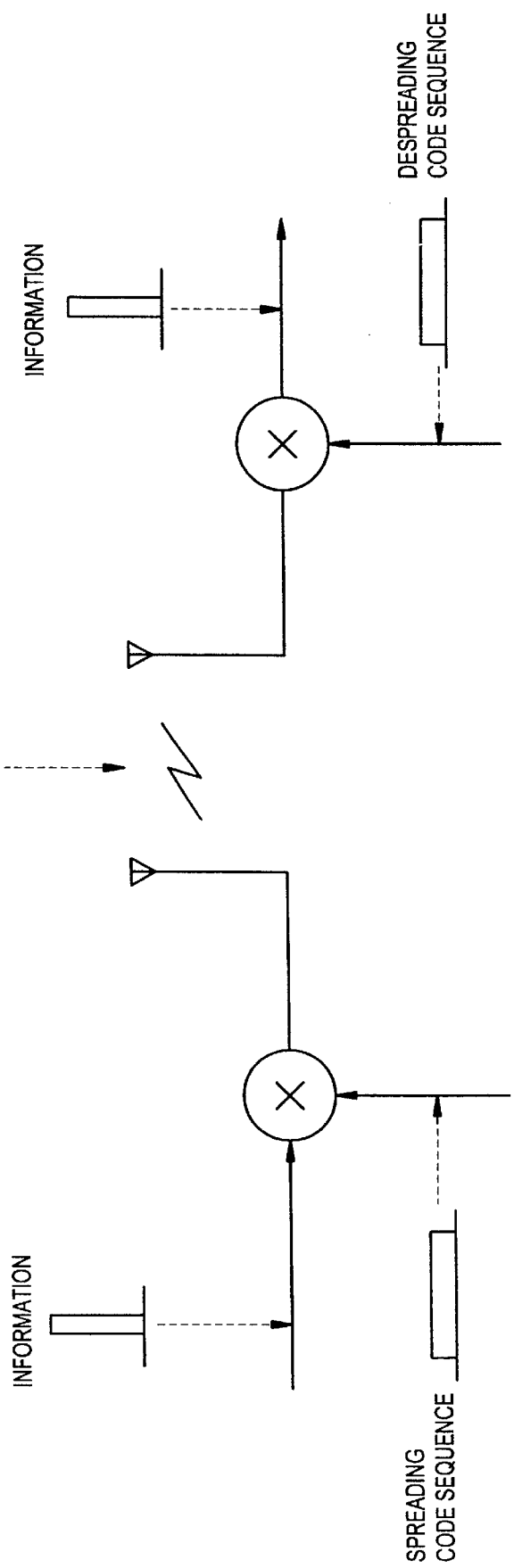
FIG. 1 is a block diagram of a typical, prior art, CDMA communications system.

The present invention is described with reference to the drawing figures where like numerals represent like elements throughout.

Figure 2:
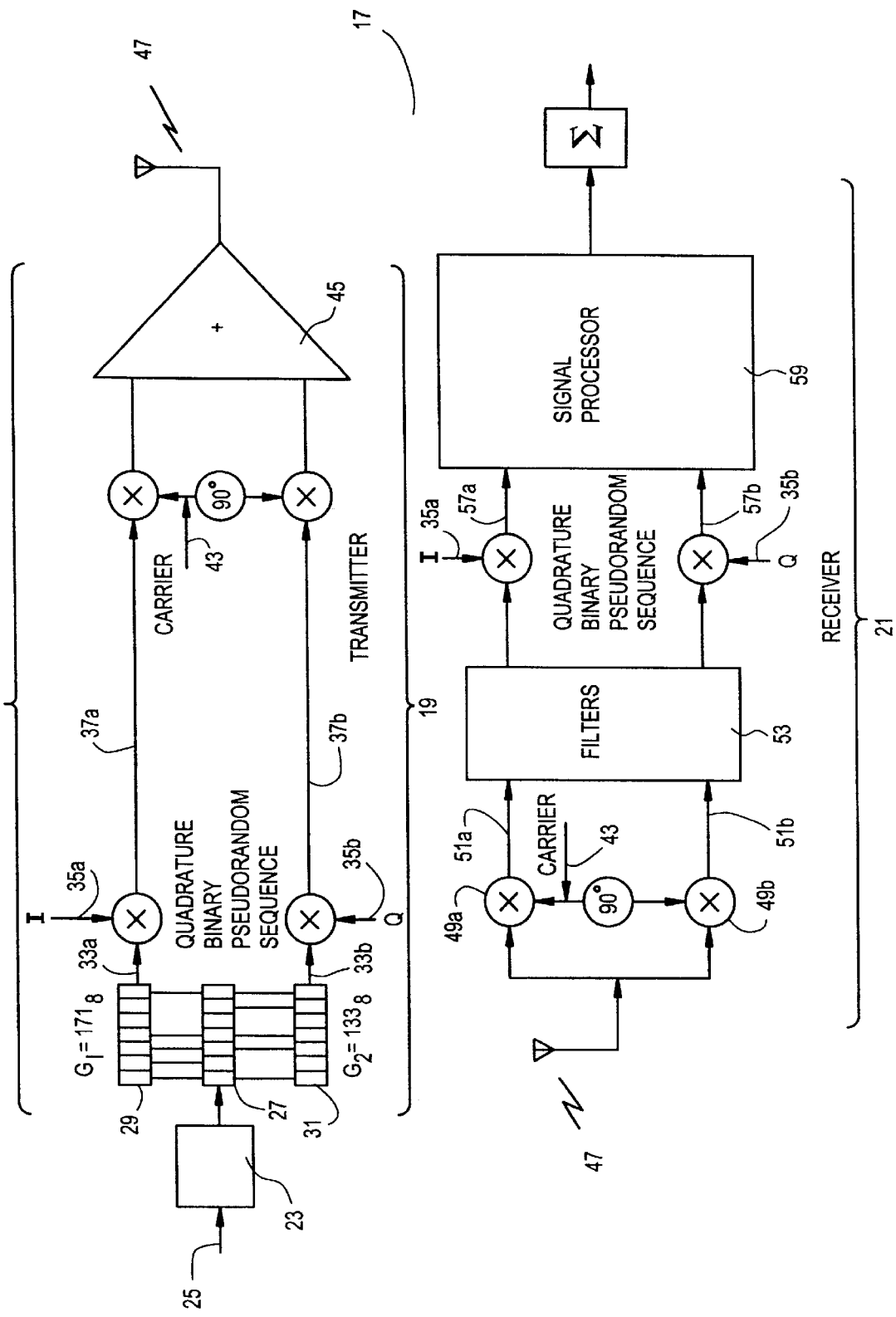
FIG. 2 is a detailed block diagram of a CDMA communications system.

The multichannel, multi-rate Viterbi decoder made in accordance with the present invention is implemented within the context of a CDMA cellular telephone system 17. Such decoders are used in multichannel wireless communication stations with the reception of communication signals. The system 17 as shown in FIG. 2 includes a transmitter 19 and a receiver 21, which may reside in either a base station or a mobile user receiver.

The transmitter 19 includes a signal processor 23 which encodes voice and nonvoice data 25 into frames of various data rates, e.g. frame rates of 8 kbps, 16 kbps, 32 kbps, or 64 kbps. The signal processor 23 selects a rate in dependence upon the amount of voice activity, if voice data, or in response to a set data rate.

Two steps are involved in the generation of a transmitted signal in a multiple access environment. First, the input data 25 which can be considered a bi-phase modulated signal is encoded using forward error-correcting coding (FEC) 27. Since a R=½ convolution code is used, the single bi-phase modulated data signal becomes two bi-phase modulated signals. One signal is designated the in-phase channel I. The other signal is designated the quadrature channel Q. Bi-phase modulated I and Q signals are usually referred to as quadrature phase shift keying (QPSK). In the preferred embodiment, the tap generator polynomials 29, 31 for a constraint length of K=7 and a convolutional code rate of R=½ are:

$$G_1 = 171_8 \text{ and } G_2 = 133_8$$

In the second step, the two bi-phase modulated data or symbols 33a, 33b are spread with in-phase (I) 35a and quadrature (Q) 35b QPSK pseudorandom sequences. The resulting I 37a and Q 37b spread signals are mixed with a carrier frequency 43, combined 45 with other spread signals (channels) having different spreading codes and transmitted 47. The transmission 47 may contain a plurality of individual channels having different data rates.

The receiver 21 includes a demodulator 49a, 49b which mixes down the transmitted broadband signal 47 into an intermediate carrier frequency 51a, 51b. The QPSK signals are then filtered 53 and mixed 55a, 55b with the locally generated QPSK pseudorandom code 35a, 35b which matches the transmitted code. Only the original waveforms which were spread by the same code at the transmitter 19 will be effectively despread. Others will appear as noise to the receiver 21. The data 57a, 57b is then passed onto a signal processor 59 where FEC decoding is performed on the convolutionally encoded data.

Figure 3A:
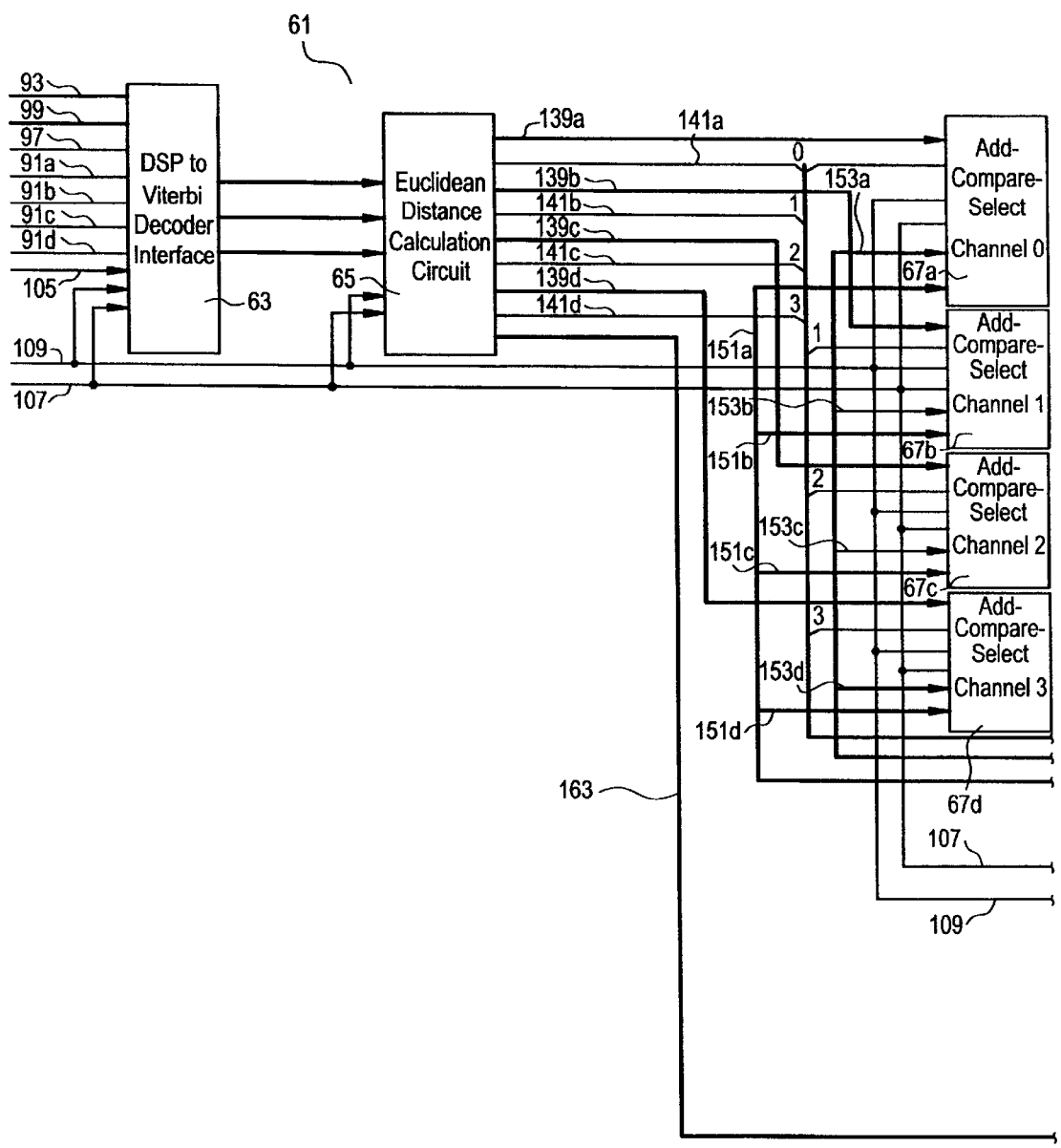
FIG. 3a is the first section of a detailed block diagram of the preferred embodiment.
Figure 3B:
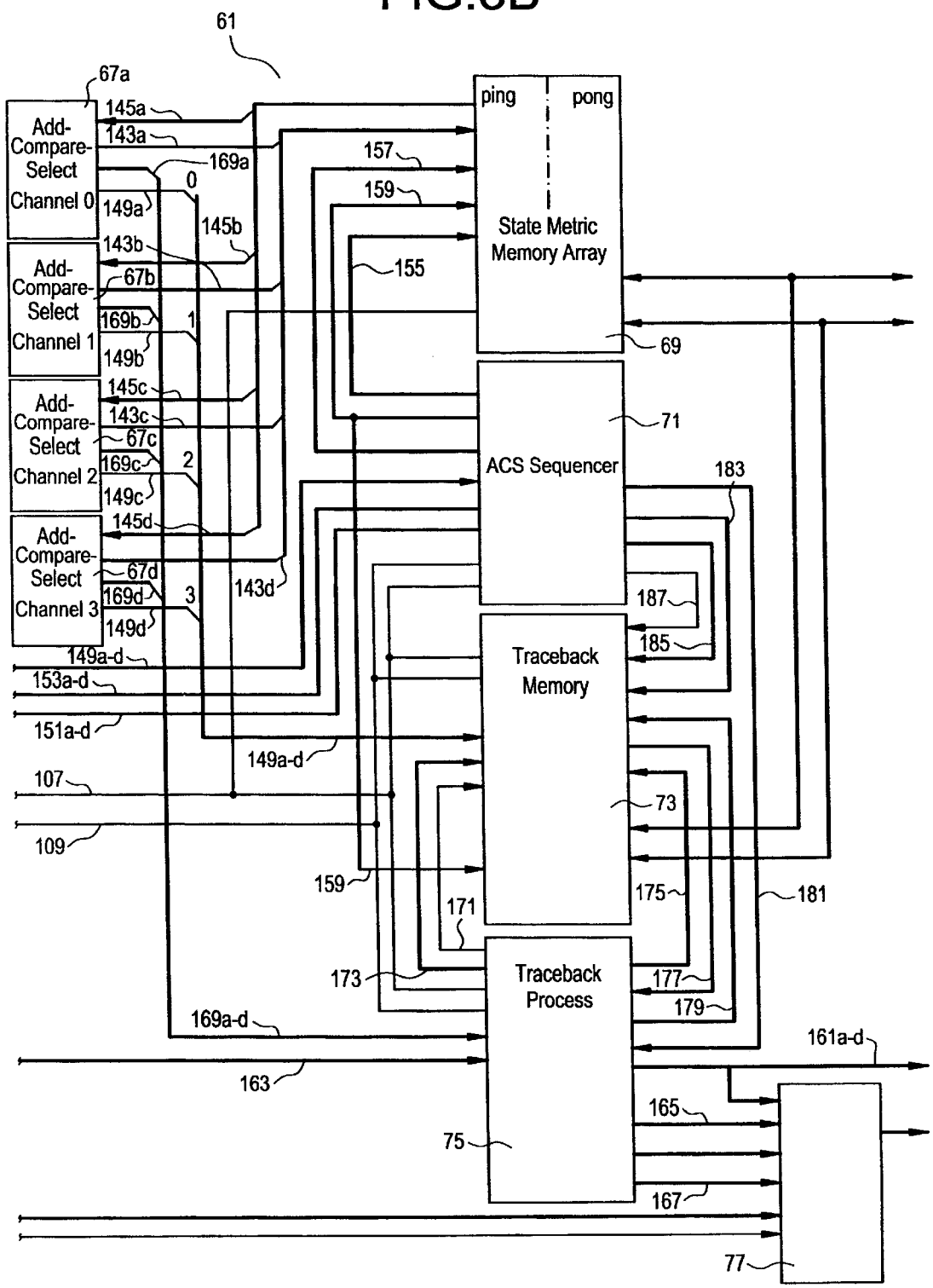
FIG. 3b is the second section of a detailed block diagram of the preferred embodiment.

The present invention 61 performs the decoding using an efficient multichannel, multi-rate Viterbi decoder 61 as shown in FIGS. 3a and 3b. The decoder 61 comprises a digital signal processor (DSP) to Viterbi decoder interface 63, a common Euclidean distance calculation engine 65, a plurality of add-compare-select (ACS) channels 67a, 67b, 67c, 67d, a state metric memory array 69, an ACS sequencer 71, a traceback memory array 73, a traceback processor 75 and a decoder to system interface 77. The system as shown in FIGS. 3a and 3b can be assembled discretely or implemented as an efficient application specific integrated circuit (ASIC) 79.

In the preferred embodiment, any of the four channels (0, 1, 2, 3) within the decoder 61 can process a plurality of data rates: 8 kbps, 16 kbps, 32 kbps or 64 kbps. Other data rates may be used in alternative embodiments. The lower data rates are achieved by enabling a time diversity combining function which operates on redundantly received symbols. This effectively increases the SNR of the time diversity received signals. For those symbols in frames corresponding to data rates less than the highest expected data rate, the symbol data is repeated to maintain a constant symbol rate for the frame.

For the 64 kbps data rate, 1 QPSK symbol is sent every 15.625 μs. For the 32 kbps data rate, the corresponding QPSK symbol is sent twice through a channel. The symbols are still sent at the 64 kbps rate, but with double redundancy thereby effectively lowering the information rate to 32 kbps. For a 16 kbps data rate, the corresponding QPSK symbols are sent through the channel with 4 times diversity. For an 8 kbps data channel, 8 times diversity.

Referring to FIGS. 3a and 3b, the multichannel decoder 61 shares common resources to minimize silicon area. As shown, the state metric memory 69 and traceback memory 73 are static random access (SRAMs) and are commonly used for each channel. Further increasing efficiency is the common Euclidean distance geometry engine 65 which computes the squared Euclidean distance between the received QPSK symbol and the four possible constellation points in the QPSK space for all four channels.

The system architecture as shown implements the Viterbi algorithm and decodes the convolutionally encoded data. The tap generator polynomials corresponding for a constraint length of K=7 and a code rate of R=½ are $G_1 = 171_8$ (29) and $G_2 = 133_8$ (31). It should be understood, that other tap generator polynominals can be used in alternative embodiments depending on different-constraint lengths and rate codes. For example, for a constraint length of K=9 and a code rate of R=½, the tap generator polynominals are $G_1=753_8$ and $561_8$. The use of tap generators are well known to those in the telecommunication arts and are used in the FEC encoder 27.

Figure 4:
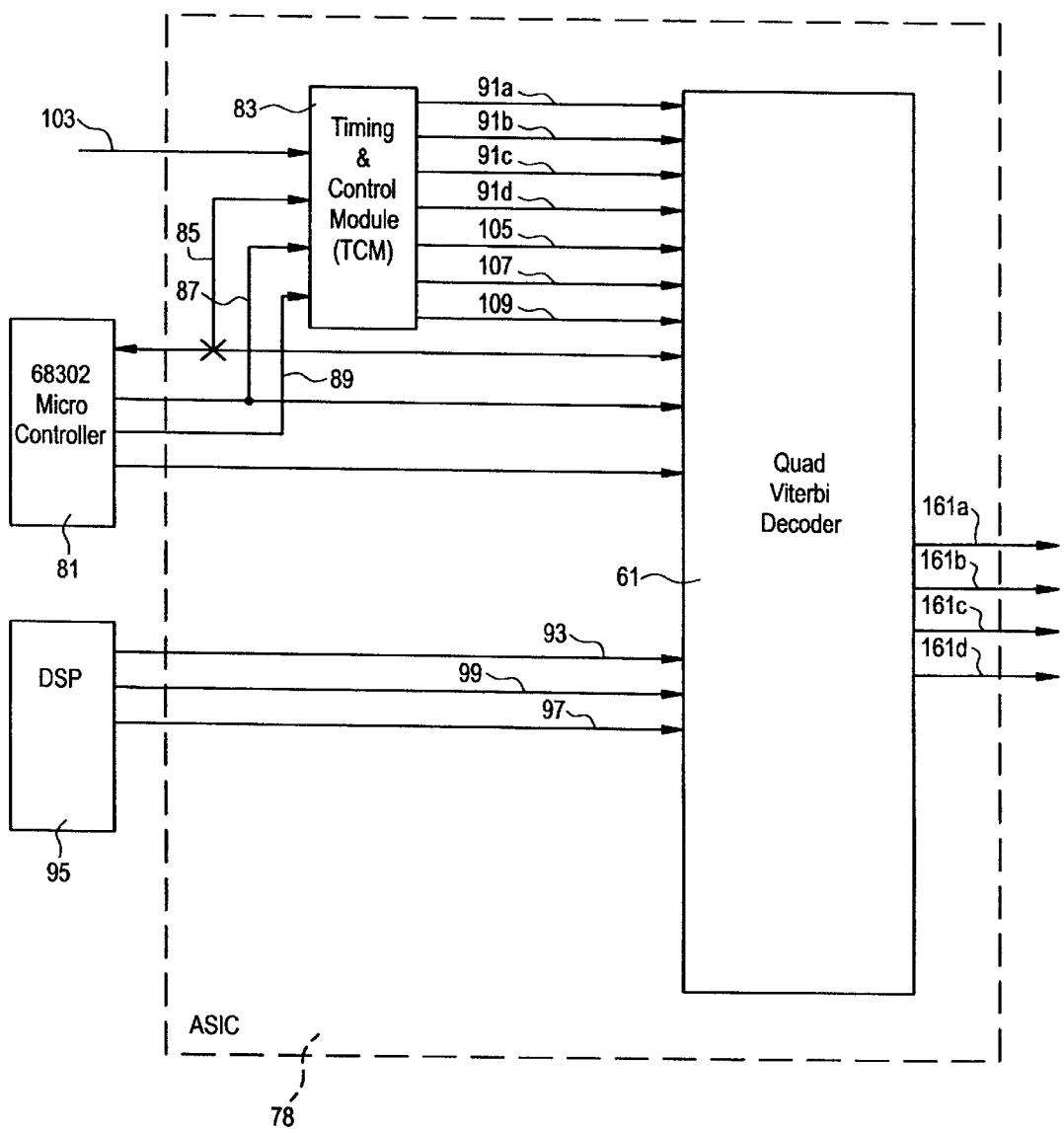
FIG. 4 is a global block diagram of the preferred embodiment.

A global system architecture is shown in FIG. 4. A host microcontroller 81 programs a timing and control module (TCM) 83 located on the ASIC 79 via microcontroller data lines 85, address lines 87 and write strobe 89. The microcontroller 81 determines from the transmitted frame the time diversity factor for a given channel. The diversity combining is controlled by selectively asserting and deasserting the diversity combining signals 91a, 91b, 91c, 91d for channels 0 through 3 respectively. A data output 93 exits a host DSP 95 and conveys the I and Q signals for all four channels to the Viterbi decoder interface 63. The host DSP 95 enabling signal 97 and address lines 99 are also coupled to the Viterbi decoder interface 63. The host microcontroller 81 controls each diversity combining signal 91a, 91b, 91c, 91d. The host DSP 95 controls the individual channel data 93 to the decoder interface 63.

The TCM 83 accepts an externally derived high frequency reference signal 103 for overall system timing. The TCM 83 uses the reference signal 103 and derives a high frequency dump 105 and viterbi clock 107 signals. The TCM 83 also produces a global decoder reset 109.

The data rate of a particular channel is lowered by the microcontroller 81 by enabling the respective diversity combining signal 91a, 91b, 91c, 91d. For a 32 kbps data rate, two adjacent symbols are combined; for a 16 kbps data rate, four symbols are combined; and for a 8 kbps data rate, eight symbols are combined.

The preferred embodiment uses time diversity to process the multi-rate data. At a 64 kbps data rate each individual transmitted bit is used. However, at the lowest data rate, 8 kbps, each bit is duplicated by a factor of 8. When processing at the lowest data rate, the redundant symbols are simply added together.

As discussed in the background of the invention, every time a symbol is sent through a respective channel a certain gain and noise figure is received. Therefore, if the same signal is sent through the channel twice, the SNR has effectively doubled. The reason being that the redundant symbols are added coherently, whereas random noise introduced does not add coherently. From the highest data rate of 64 kbps to the lowest 8 kbps the signal gain is effectively multiplied by a factor of 8.

By lowering the data bit rate and using time diversity, the signal transmitting power can be lowered commensurately since the gain will be recovered when the diverse symbols are assembled. The use of diversity combining arrives at lower data rates without suffering detrimental effects to lower SNRs.

For the maximum data throughput of 64 kbps, the diversity combining function must be disabled. This is implemented by keeping the diversity combining signal 91a, 91b, 91c, 91d high for that particular channel. When the multichannel decoder 61 is operated at lower data rates, the diversity combining signal 91a, 91b, 91c, 91d controls which adjacent symbols are combined, when the decoder is enabled, and when the interface 63 is cleared for a new set of symbols.

Figure 5:
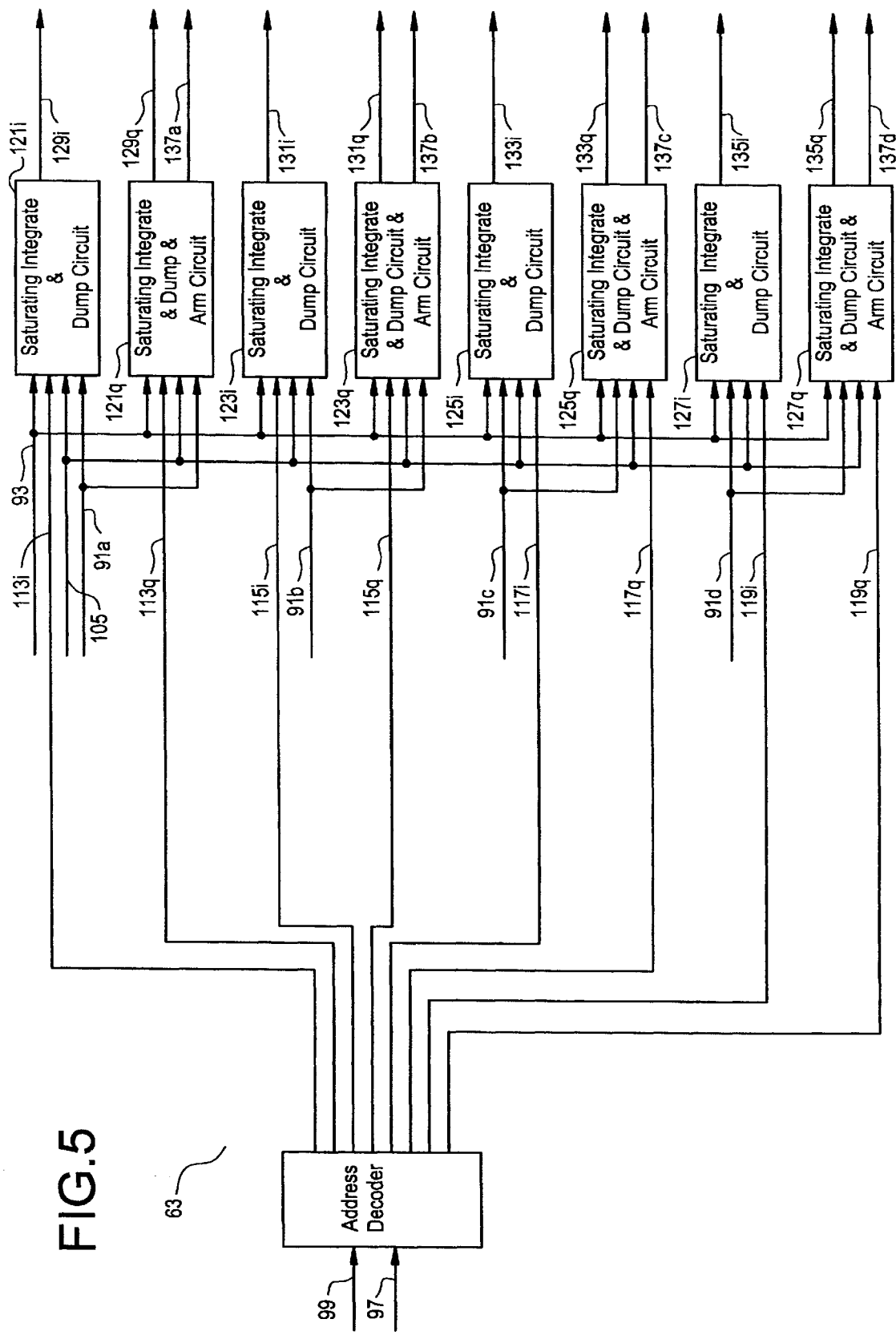
FIG. 5 is a block diagram of the interface between a host digital signal processor and the preferred embodiment.

As shown in FIG. 5, the decoder interface 63 accepts 8 bit two's compliment I and Q samples over the host DSP 95 data bus 93. The data from the host DSP 95 is input over the data bus 93 into an address decoder 111. The data bus 93 is a parallel input bus, however the data arrives sequentially between all 4 channels. The data is then separated into the individual in-phase and quadrature components for each channel and output to each saturating integrate and dump circuit 113I, 113Q, 115I, 115Q, 117I, 117Q, 119I, 119Q, over lines 121I, 121Q, 123I, 123Q, 125I, 125Q, 127I, 127Q, for channels 0–3 respectively. The interface 63 includes 8-bit accumulators that have saturating logic. The maximum positive saturation value is $0x7f_{16}$ and the maximum negative saturation value is $0x80_{16}$.

Within the Viterbi decoder interface 63, the time diversity combining is performed using binary two's compliment operations. All of the redundant I and Q samples are added when at the lower data rates. Similarly, saturating adders are used to eliminate sign change if there is an overflow. Rather than the diversity combining function residing in a separate DSP IC, the custom feature has been included on the ASIC. After the diversity combining function is performed, the results are output on lines 129I, 129Q, 131I, 131Q, 133I, 133Q, 135I, 135Q for channels 0–3 respectively. The saturating integrate dump circuits also control the Euclidean distance calculation engine 65 enables 137a, 137b, 137c, and 137d for channels 0–3 respectively.

Referring back to FIGS. 3a and 3b, all of the multichannel decoder 61 internal processors are synchronized to the Viterbi clock 107. The host DSP 95 is clocked by its own asynchronous clock (not shown). The DSP clock and the dump signal 105 are resynchronized to the Viterbi clock 107. The decoder 61 requires that the Viterbi clock 107 must be marginally faster than the dump signal 105.

All of the channels are coupled from the decoder interface 63 to the Euclidean distance calculation engine 65 on individual I and Q and enable lines as shown in FIG. 4. Referencing FIG. 3a, the Euclidean distance calculation engine 65 computes the four square Euclidean distances between each received I and Q symbol and the four possible QPSK constellation points. A common engine computes the distances for each channel only when enabled by its respective channel.

Figure 6:
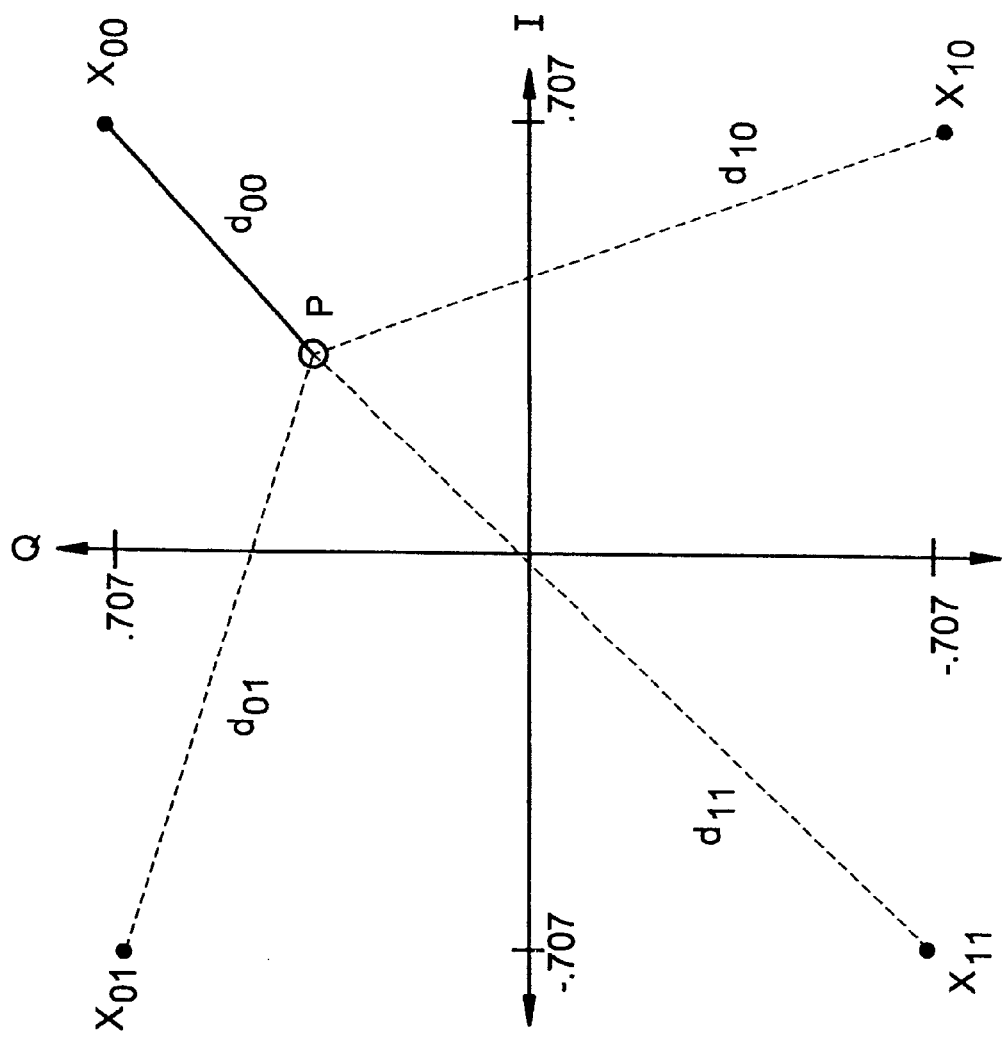
FIG. 6 is a diagram of the QPSK constellation.

As shown in FIG. 6, the Euclidean distance calculation engine 65 compares all received symbols p per channel by mapping them onto a QPSK constellation $x_{00}$, $x_{01}$, $x_{10}$, $x_{11}$. It is necessary to examine each received point p due to corruption during transmission 47 by noise and distortion, whether multipath or radio frequency. The geometry engine 65 computes the four distances $d_{00}$, $d_{01}$, $d_{10}$, $d_{11}$ from the received symbol p and chooses the shortest distance $d_{00}$.

The enabling mechanism used is based upon the transmitted data rate for a particular channel. A gain in overall processing efficiency is achieved since the calculations are only performed in the Euclidean distance engine 65 if a new I and Q symbol has been released to it and the geometry engine 65 has been properly enabled. Efficiency increases since it does not waste any calculations when processing lower rate data.

Referring back to FIGS. 3a and 3b, after the Euclidean distances have been computed, discrete 12-bit outputs 139a, 139b, 139c, 139d for each channel along with associated enable signals 141a, 141b, 141c, 141d are serially coupled to four discrete ACS circuits 67a, 67b, 67c, 67d where the Euclidean distances are mapped onto a trellis based on the encoder. The use of a trellis scheme for decoding FEC convolutionally encoded data is well known to those familiar with the art.

The present invention normalizes every symbol and computes the shortest trellis distance using saturating logic. Previous state metrics are added to each newly received transmitted symbol. Each individual data point per channel develops and updates the trellis. The state metric data is read from state metric memory 69. The ACS circuits 67a, 67b, 67c, 67d implement the Viterbi algorithm. The maximum likelihood decoder relies upon the trellis which is an infinite replication of a state diagram. Any code word of a convolutional code corresponds to the symbols along a path in the trellis diagram. At each state and at each level of the trellis involves an ACS operation. To implement a decoder based upon the Viterbi algorithm requires storage for two different sets of data. The first storage is for the path state or metric memory 69 updated for each successive level of the trellis. The second set of data are the selections at each node or state in the trellis called path memory 73.

In the prior art, each respective decoder or ACS circuit would require individual storage for the two sets of data. In the present invention, both metric 69 and path memory 73 arrays are consolidated in one common memory for each channel in a novel manner to significantly reduce the size of the silicon area. Also, common addressing and data transfer is further combined increasing efficiency. The state metric data is written to 143a, 143b, 143c, 143d and read from 145a, 145b, 145c, 145d the state metric memory 69.

There are two possible trellis paths terminating into each state. A pruning operation in the ACS circuits 67a, 67b, 67c, 67d is performed where the best metric terminates into a given state. The best metric is determined by choosing the smallest accumulated trellis distance. The path chosen, upper or lower, is represented by a 0 or a 1 respectively. This information is written to the traceback memory 73 on lines 149a, 149b, 149c, 149d.

The trellis is assembled over many received symbols. The preferred embodiment requires 35 symbols in discrete time and is updated upon the reception of each clocked symbol. After 35 symbols have been accumulated, a determination finds the trellis path that has the smallest error. This method of decoding determines which QPSK symbol was sent. The trellis structure introduces redundancy and accumulates the past history.

One ACS circuit 67a for channel 0 is shown in FIG. 7. Each new symbol representing one QPSK constellation point is input 139a. Since every node in the trellis has two paths entering and exiting, the values are split and selected based upon the present state in the trellis and what was encoded. Each constellation value is input into separate 4-input multiplexers 189u, 189l. The output 191u, 191l from each multiplexer 189u, 189l is based upon the present state in the trellis and the encoder. This decision 153a originates in the ACS sequencer 71 which will be discussed later in the specification. The state metric 145a is read from memory 69 and is similarly split for both the upper and lower paths and input to mirrored 8-bit flip-flops 193u, 193l. The flip-flops 193u, 193l output into saturating subtracters 197u, 197l with the previous best metric 201 and combined with the new symbol value 191u, 191l with saturating subtracters 199u, 199l. Both the upper and lower path of each trellis node is compared with an 8-bit magnitude comparator 203. Each ACS channel processes 64 trellis states for each particular symbol. Each path is examined to determine which distance or trajectory is the shortest. Both the upper and lower paths 205u, 205l are input into a 2-input multiplexer 207 where the shortest distance or best metric 143a is chosen and stored in memory 209. This value is used with the next symbol input for normalization. The present invention post-normalizes all inputs for each operation.

Normalization in the prior art is typically performed on a block basis or after many symbols of information have been processed. However, by post-normalizing after each metric is chosen, performance noticeably improves. Post-normalization does require saturating logic since the normalization process may result in overflow. If saturating logic is not employed, the number may ultimately overflow and the binary number may vary wildly from the desired value. The system cannot determine if the value is realistic. By using saturating logic, the value will ultimately plateau.

Since every node on the trellis has two paths terminating in it and two paths originating from it, the process must constantly prune. The trellis represents the metrics for two paths where a decision chooses one path which is based on the shorter distance. The better path or best metric is stored in the state metric memory 69 and the decision or path bit is stored in the traceback memory 149a, 149b, 149c, 149d.

At the start of a symbol, each ACS channel 67a, 67b, 67c, 67d will receive a decoder start signal 141a, 141b, 141c, 141d to initialize the channel. As discussed above, the winner of the pruning operation that was stored in memory is compared against the first, if the second winner is smaller than the first then that particular value is chosen as the best metric. This operation is similar for the remaining 63 outputs of the trellis.

The historical dependency upon symbols as they enter into a Viterbi decoder accumulates energy from the many symbols rendering tremendous gain. The gain in energy is based upon integrating the energy of over 35 symbols which in effect narrows the bandwidth.

The sequencing of the ACS 67a, 67b, 67c, 67d operation is controlled by the ACS sequencer 71 over lines 151a, 151b, 151c, 151d. A single ACS sequencer 71 is used to control the individual ACS circuits 67a, 67b, 67c, 67d for each channel being decoded. When a particular channel has not been enabled 141a, 141b, 141c, 141d, either because of a lower data rate or if the channel is vacant, the write operations to state metric 69 and path 73 memories for that particular channel are inhibited via lines 153a, 153b, 153c, 153d.

The ACS sequencer 71 controls the entire operation of the present invention. The function of the ACS sequencer 71 is similar to a state machine. However, rather than using a programmable device and download executable code normally seen in the prior art, the ACS sequencer 71 is executed strictly in hardware yielding unexpected efficiency.

Figure 8A:
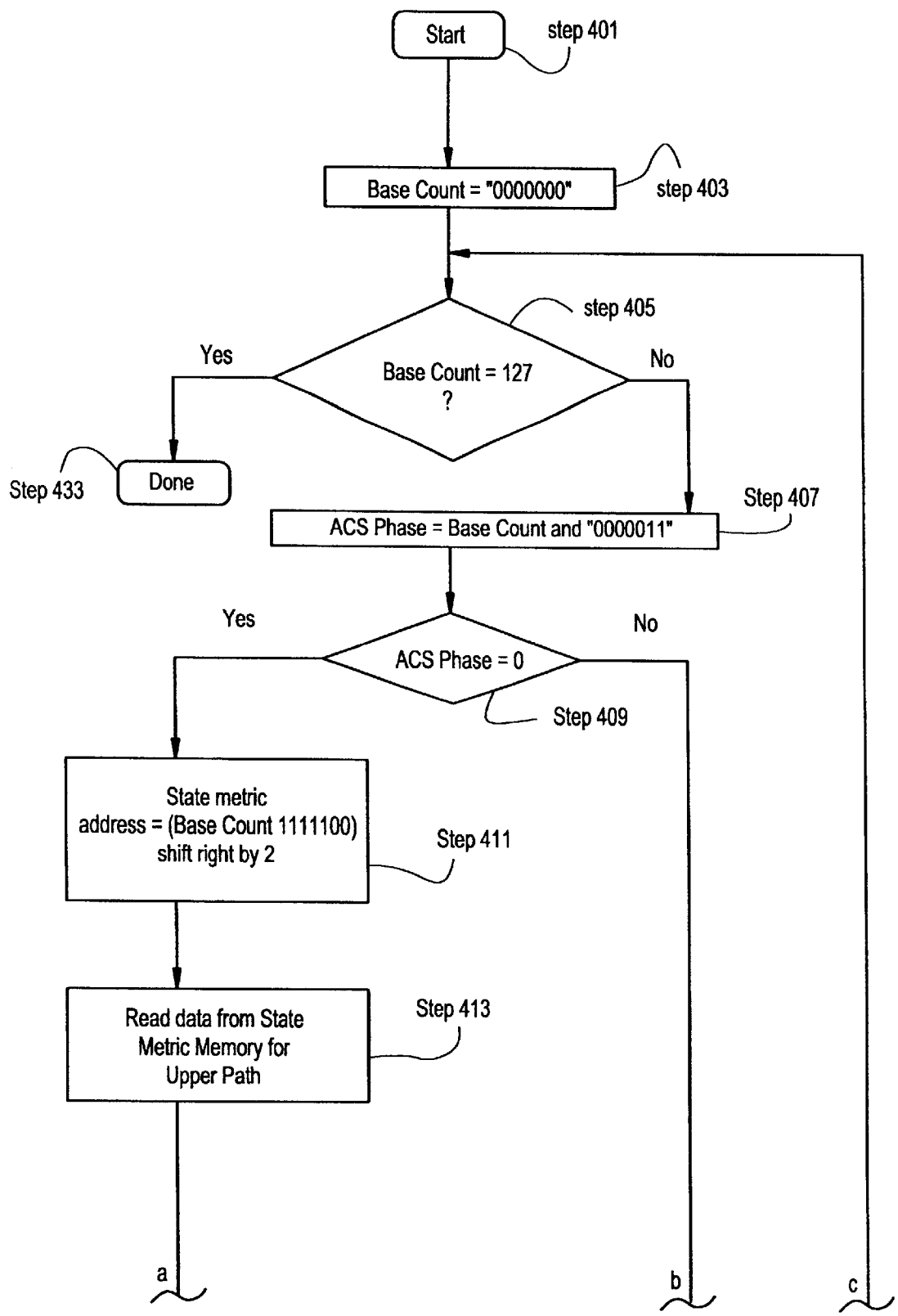
FIG. 8a is the first section of a flow diagram of the add-compare-select sequencer.
Figure 8B:
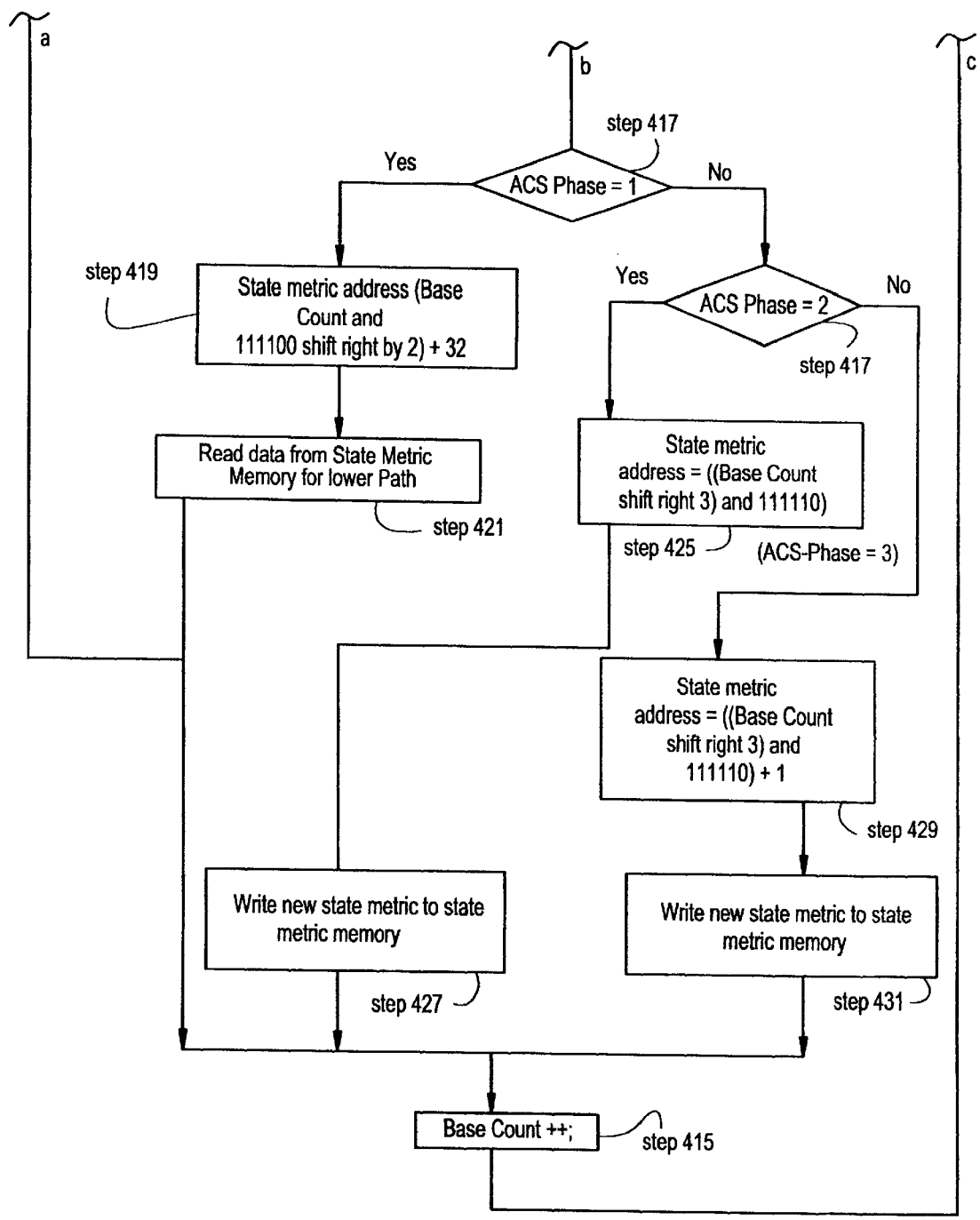
FIG. 8b is the second section of a flow diagram of the add-compare-select sequencer.

The operation of the ACS sequencer 71 is similar to that of a counter driven by a counter and controls the four independent ACS circuits 67a, 67b, 67c, 67d in parallel with one common memory 69. The ACS sequencer 71 also functions as a bit slice array processor. A flow diagram for the ACS sequencer 71 is shown in FIGS. 8a and 8b. After initialization (step 401), the ACS sequencer 71 establishes a base count that equals zero (step 403). Since a sequencer is essentially a counter, a return path is required for counting up (step 415). A decision (step 405) determines whether the process is complete depending upon incrementing from 0 to 127, matching the 64 read and 64 write operations of the trellis. The sequencer is clocked at the Viterbi rate driving the addressing (steps 411, 419, 425, 429) and sequencing of the addresses, and the sequencing of the read (steps 413, 421) and write (steps 427, 431) operations. The ACS sequencer 71 processes each ACS channel 67a, 67b, 67c, 67d in parallel with one common memory 69.

The state metric memory array 69 is 64 bits wide and arranged into a ping segment and pong segment. The first 32 bits is the ping and the second 32 bits of the 64 bit word is the pong segment. Each 8-bit segment out of the 32 bit segment represents a different channel (0, 1, 2, 3). When the ACS sequencer 71 is reading from the pong segment, it will be writing into the ping segment in sequence. The sequencer will read from ping and write to pong, and, with the next symbol, will read from pong and write to ping. This method of shared memory access is known to those familiar with this art.

The ACS sequencer 71 handles four channels that can be processing data at different data rates such that the sequencer 71 may be reading from ping for channel 0, reading from pong for channel 1, not performing any read or write for channel 2 and reading from ping for channel 3. This method of memory access is extremely flexible. This is accomplished by each channel having a devoted start signal 141a, 141b, 141c, 141d.

The ACS sequencer 71 accesses the state metric memory array 69 and each ACS circuit 67a, 67b, 67c, 67d by examining the base count (step 405) and observing the two least significant bits (LSB) of the base count (step 407). The first two states of the sequence are always read (step 413, 421) operations. The last two states of the sequence are the write (step 427, 431) operations. The write operations post the results to state metric memory 69.

Figure 9:
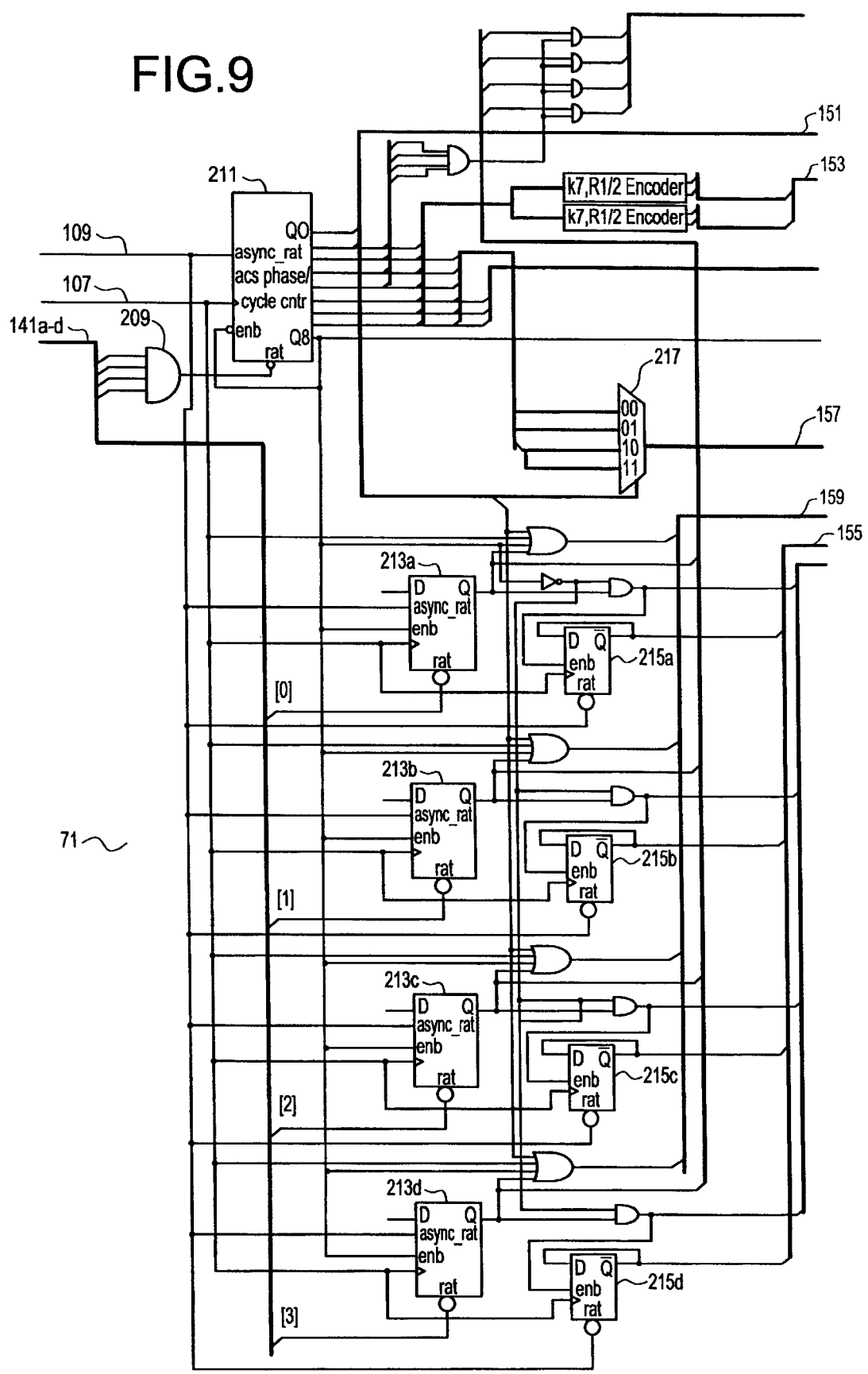
FIG. 9 is a detailed block diagram of the add-compare-select sequencer.

As shown in FIG. 9, the implementation of the ACS sequencer 71 is performed with minimal hardware. Counter 211 provides the base count with flip-flops 213a, 213b, 213c, 213d, 215a, 215b, 215c, 215d, providing the shifting operations and writing and reading for the four variable rate data channels. A 4-input multiplexer 217 accesses the state metric addresses for all channels.

The state metric memory array 69 has sufficient storage for 64 state metrics per channel. To facilitate reading from 145a, 145b, 145c, 145d and writing to 143a, 143b, 143c, 143d the state metric memory array 69, the ping-pong organization for the memory facilitates both operations during the individual ACS operations coordinated by the ACS sequencer 71 over the ping-pong line 155 and address bus 157. The total capacity of the state metric memory SRAM array 69 is 4,096 bits.

The traceback memory array 73 is used to record which path was the survivor into every state for each decoded symbol. Since a trellis diagram is an infinite replication of a state diagram in theory, an infinite amount of memory would be necessary to record all information for every transmitted symbol. However, the traceback history is only maintained for 35 consecutive symbols and is overwritten from the ACS circuits 67a, 67b, 67c, 67d over lines 149a, 149b, 149c, 149d. The traceback memory 73 requires 8,960 bits of SRAM organized in a 32 by 280 array. The traceback is 35 symbols deep, therefore, before a decoded symbol is output, an accumulation of 35 symbols of information has taken place. The input symbol that produces a given output occurred 35 symbols earlier in time.

The traceback memory 73 is arranged as a circular buffer. Each time a new symbol is written to the traceback memory 73, all of the previously stored symbols are displaced, discarding the oldest symbol value. The memory required is based upon the rule of 5 times the constraint length, thereby 35 symbols worth of memory are necessary for a K=7 constraint length.

Figure 10:
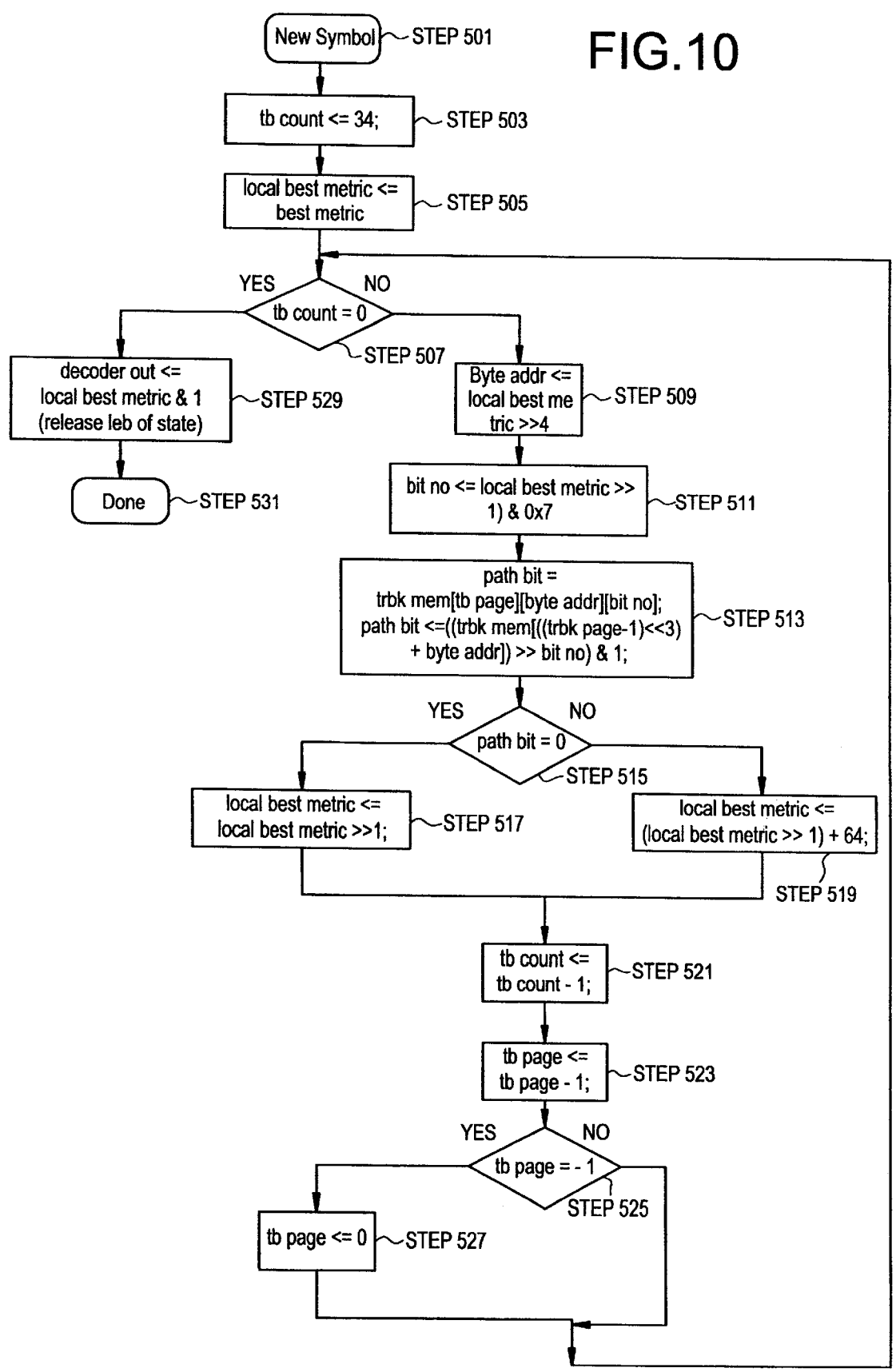
FIG. 10 is a flow diagram of the traceback process.

The traceback operation is shown in FIG. 10. The traceback processor 75 is a recursive operation similar to the ACS processor 71 in that a counter is initialized (step 501) and set (step 503) assigning a value of 34 as discussed above (5 times the constraint length). The local best metric is then assigned the best metric value (step 505). A decision must be made whether the traceback count is equal to 0 (step 507). If the traceback count equals 0, the process is finished (step 531) and the trajectory that was most probable is known and the decoder outputs a bit (step 529). If the traceback count is not 0, the operation is performed again to arrive at the best metric.

Since four different data rates can be processed, the traceback memory 73 is consumed accordingly, i.e. if channel 0 is running at 64 kbps, after 35 symbols on channel 0 the traceback memory would be filled for that particular channel, however, if channel 2 is running half the rate, i.e. at 32 kpbs, channel 2 would only fill up half the traceback memory 73.

The traceback memory 73 is allocated in sequence since one channel may be greatly delayed relative to another channel. The traceback process 75 is unique for each channel since the data that was encoded at the transmitter is unique. Therefore, the tracing back operation for each of the four channels will be unique. Additionally, the data rates between the four channels may be different.

The traceback process is serial and the processor 75 functions sequentially for channel 0, then channel 1, then channel 2 and finally channel 3 since the addresses are not common. The storage of the traceback information is address dependent requiring segregating each process for each channel in time. If all four channels are transmitted at the maximum rate, the memory would still require segregation since the data that was coded at the transmitter created a different trellis or traceback trajectory between each of the four channels. Processing them at different data rates further complicates the process.

Referring to the flow diagram in FIG. 10, if the traceback count does not equal 0 (step 507) the process must traceback through time for the trajectory that is most probable. The processor reads the 9-bit address which includes a field, a byte address, and a bit address. This is performed by shifting right the address by 4 bits (step 509), then shifting right by 1 bit (step 511) and masking off the 3 least significant bits (step 513). The local best metric is a 7-bit number. The 4 most significant bits will become the byte address, the next 3 bits will become the bit number, and the 4 least significant bits are ignored. The path bit is examined (step 515) to see whether it is a 1 or a 0. If the path bit is a 0, the previous local best metric value is shifted right by 1 which effectively divides it by 2. If the path bit equals 0, the local best metric is shifted right by 1 (step 517). If the path bit does not equal 0, 64 is added to the local best metric thereby placing the result between a value of a 32 and 63. The processor 75 keeps track (steps 521, 523, 525, 527) of all the trajectories and is repeated until the encoded bit is found.

The processor finds the trajectory that terminates in all of the 64 states with the minimum energy indicating the minimum error. The traceback memory stores the 35 trajectories associated with all 64 states with one bit indicating whether the trajectory is coming from above or below since there are only two paths into a given state. Therefore, a 0 or 1 indicates the path. The associated bit path for the local best metric is stored along with the byte address and the bit address. Since all of the information is stored in bytes, a decomposition is performed since there are 64 states, with 8 bytes, with 8 bits per byte. Since there are 8 bits within the first byte, the 8 bits would indicate states 0 through 7. This indicates which local best metric is pointing to these states. The next byte would be for states 8 through 15 and so on to the 63rd state.

The process always discards the least significant bit out of the 7-bit number. The 3 most significant bits as discussed earlier point to a particular byte address. The 3 bits following the 3 most significant bits point to a particular bit in the byte address. That is the path bit. The path bit is used to modify the local best metric.

The traceback process operates 512 times faster than the maximum throughput rate. The control of the address bus is coordinated between the ACS sequencer 71 and the traceback processor 75. During the ACS phase of the decoder operation, the ACS sequencer controls via lines 151a, 151b, 151c, 151d the address bus 159 of both the state metric and the traceback memories. After the ACS operation is completed, control of the traceback memory address bus is handed over to the traceback processor 75.

The traceback memory 73 is used in a procedure called "chaining back" or tracing back starting with the last node in the trellis, tracing the decision path backward from the last decision to the first. This process determines the decoded symbol to be released as an output 161a, 161b, 161c, 161d. The traceback process for the four channels cannot be performed in parallel within a common SRAM block 69, 75 since the addressing characteristics of the traceback process for the separate data channels are expected to be independent. It is necessary to sequence the traceback process for each individual channel. If a particular channel was not enabled for a particular symbol interval, the traceback process for that channel is skipped. The process requires a minimum of 35 clock cycles to perform the traceback process for a given channel.

The present invention also has a performance diagnostic feature that calculates the bit error rate. The Euclidean distance engine 65 outputs a hard decision 163 into the traceback processor 75. The hard decision is buffered in a 35 symbols first-in-first-out (FIFO) and then compared to the reconvolutionally encoded symbol output 161a, 161b, 161c, 161d which was released by the traceback processor 75. The bit differences between the two are accumulated. After 256 symbols, the accumulator in the traceback processor 75 is emptied 165 into a bit error rate output circuit 77 shown in FIG. 7. When a new 8 bit accumulated bit error rate value is ready for the host microprocessor to read, the BER ready signal 167 for that particular channel is enabled.

Figure 11:
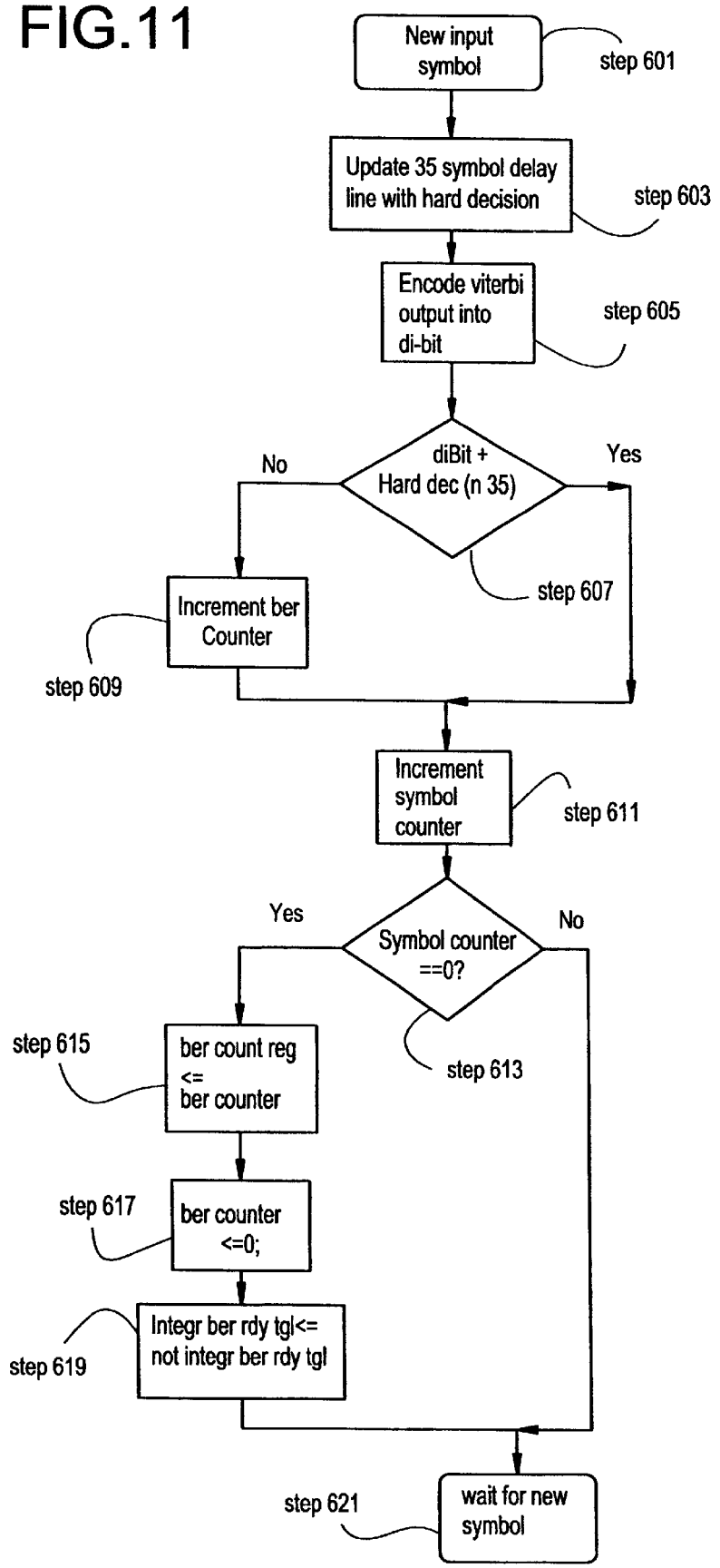
FIG. 11 is a flow diagram of the bit-error-rate process.

As shown in the flow diagram in FIG. 11, the bit error rate diagnostic process is described. For the bit error rate calculation, the process requires a transmitter portion and a receiver portion. Data will be introduced (step 601) to the transmitter and will undergo forward error-correcting coding, QPSK modulation, and quadrature signal spreading. The signal will not undergo transmission but will be input directly into the receiver portion where the signal will be despread. The output of the despreading process will bypass the Viterbi decoder (step 603) and will be delayed for 35 symbols (steps 607, 609, 611) to allow the Viterbi decoder to decode the information (step 605). The data that underwent the hard decision (not decoded) will be compared with the Viterbi decoder output. This provides an indication of SNR and processor performance.

Figure 12:
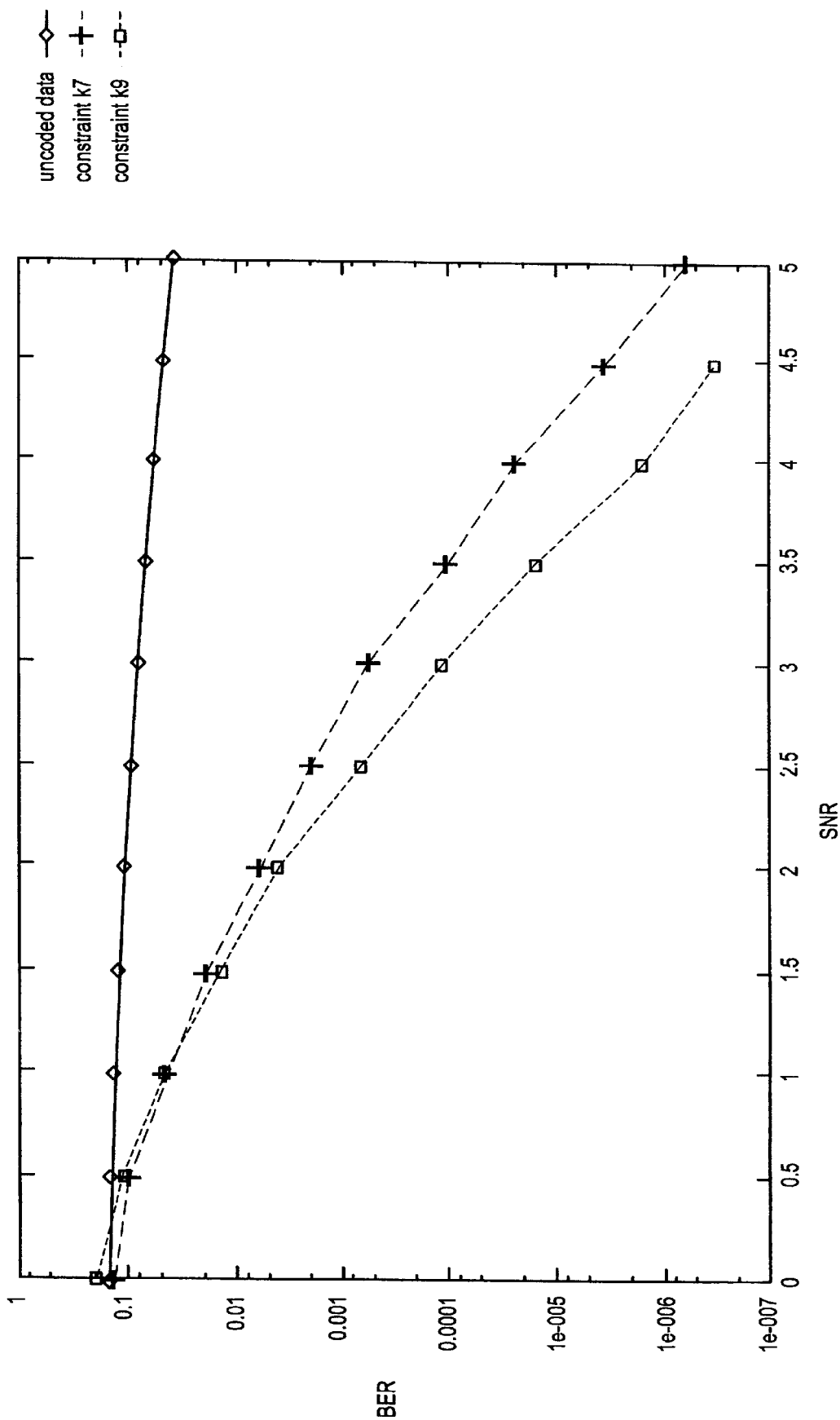
FIG. 12 is a plot of bit error rate (BER) performance versus signal-to-noise ratio.

The performance of the present invention is shown in FIG. 12. FIG. 12 shows a plot of bit error rate probability versus signal-to-noise ratio comparing unconvolutionally encoded data with encoded data. Two embodiments of the invention are shown. The first embodiment uses a constraint length of K=7. An alternative embodiment uses a constraint length of K=9. As can be seen on the plot, as the signal-to-noise ratio increases to 5, the performance of the unconvolutionally encoded data exhibits a 0.05% bit error probability. However, at the same signal-to-noise ratio, convolutionally encoded data exhibits a dramatic increase in performance upwards of one bit error in one million. The plot also shows an improvement over the constraint length of 7 when an alternative embodiment employing a constraint length of 9 is used.

Rather than assembling a quad Viterbi decoder having four input channels, each having two pairs of I and Q signals, one distance calculation engine is used to throughput four channels and output 16 distances. The 16 distances are then coupled to ACS blocks. The outputs of the Euclidean distance calculation block are then apportioned per the individual ACS block on a per channel basis.

In an alternative embodiment, rather than having four discrete ACS blocks for each individual channel, a drastic reduction could be formed with a linear increase in clock speed. The ACS feature which incorporates the trellis operation can be reduced to two or even one ACS circuit by multiplexing the data input along with an increase in clock speed.

Figure 13:
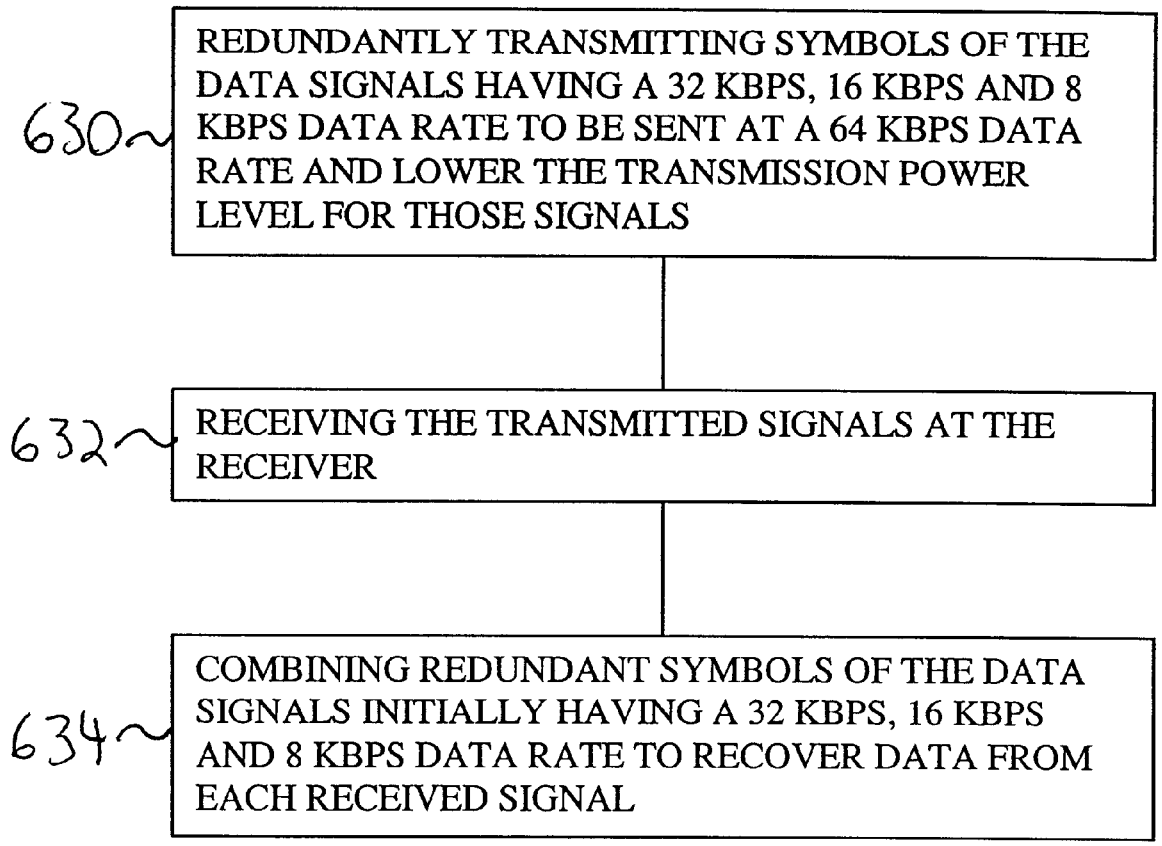
FIG. 13 is a flow diagram of redundant symbol transmission.

FIG. 13 is a flow diagram of redundant symbol transmission. For the data signals having a 32 kbps, 16 kbps and 8 kbps data rate, redundantly transmitting those data signals' symbols to achieve a transmission data rate of 64 kbps, 630. The transmitted signals are received at the receiver, 632. Symbols of the data signals initially having a 32 kbps, 16 kbps and 8 kbps data rate are redundantly combined to recover those signals' data, 634.

While specific embodiments of the present invention have been shown and described, many modifications and variations could be made by one skilled in the art without departing from the spirit and scope of the invention. The above description serves to illustrate and not limit the particular form in any way.

What is claimed is:

1. A method for simultaneously receiving a plurality of channel signals in a shared spectrum of a wireless spread spectrum code division multiple access communication system, the system transmitting the channel signals using quadrature phase shift keying modulation, the channel signals having differing data rates and a same transmission data rate, the method comprising:

receiving signals transmitted over the shared spectrum;

demodulating the received signals to produce an in-phase intermediate frequency signal and a quadrature phase intermediate frequency signal;

despreading with a code associated with each channel signal the in-phase and the quadrature phase intermediate frequency signals to produce a despread in-phase and a despread quadrature phase signal for each channel signal;

for each channel signal having its data rate below the transmission data rate, combining received symbols of the despread in-phase and quadrature phase despread signals so that after the combining that channel's despread in-phase and quadrature phase signals have that channel's data rate; and simultaneously processing each channel signal's despread in-phase and quadrature phase despread signals after the combining to recover data for each channel signal.

2. The method of claim 1 wherein the demodulating is performed using an in-phase and a quadrature phase carrier.

3. The method of claim 1 wherein the despreading with the code associated with each channel signal is by respectfully mixing the in-phase and the quadrature phase intermediate frequency signals with an in-phase and a quadrature phase code associated with each channel signal.

4. The method of claim 1 wherein the combining of received symbols for each channel signal is by combining adjacent symbols of the despread in-phase and quadrature phase despread signals.

5. The method of claim 4 wherein the adjacent symbols are combined by adding the adjacent symbols.

6. The method of claim 1 wherein the transmission data rate is 64 Kbps and the differing data rates are 64 Kbps, 32 Kbps, 16 Kbps and 8 Kbps.

7. The method of claim 1 wherein each channel's data signal is convolutionally encoded and the simultaneous processing of each channel comprises simultaneously decoding each channel's despread in-phase and quadrature phase signals by a viterbi decoder.

8. The method of claim 1 wherein the plurality of channel signals is four channel signals.

9. A receiver for simultaneously receiving a plurality of channel signals in a shared spectrum of a wireless spread spectrum code division multiple access communication system, the system transmitting the channel signals using quadrature phase shift keying modulation, the channel signals having differing data rates and a same transmission data rate, the receiver comprising:

an antenna for receiving signals transmitted over the shared spectrum;

a first in-phase and quadrature phase mixer for demodulating the received signals to produce an in-phase intermediate frequency signal and a quadrature phase intermediate frequency signal;

for each channel signal, a second in-phase and quadrature phase mixer for mixing a code associated with that channel signal with the in-phase and the quadrature phase intermediate frequency signals to produce a despread in-phase and quadrature phase signal for each channel signal;

an interface for each channel having its data rate below the transmission data rate, for combining received symbols of the despread in-phase and quadrature phase despread signals so that after the combining that channel's despread in-phase and quadrature phase signals have that channel's data rate; and a decoder for simultaneously processing each channel signal's despread in-phase and quadrature phase despread signals after the combining to recover data for each channel signal.

10. The receiver of claim 9 wherein the first in-phase mixer mixes the received signal with an in-phase carrier and the first quadrature phase mixer mixes the received signal with a quadrature phase carrier.

11. The receiver of claim 9 wherein for each channel signal, the second in-phase mixer mixes the in-phase intermediate frequency signal with an in-phase code of that channel signal and the second quadrature phase mixer mixes the quadrature phase intermediate frequency signal with a quadrature phase code of that channel signal.

12. The receiver of claim 9 wherein the interface combines received symbols for each channel signal by combining adjacent symbols of the despread in-phase and quadrature phase despread signals.

13. The receiver of claim 12 wherein the adjacent symbols are combined by adding the adjacent symbols.

14. The receiver of claim 9 wherein the transmission data rate is 64 Kbps and the differing data rates are 64 Kbps, 32 Kbps, 16 Kbps and 8 Kbps.

15. The receiver of claim 9 wherein each channel's data signal is convolutionally encoded and the decoder is a viterbi decoder.

16. The receiver of claim 9 wherein the plurality of channel signals is four channel signals.

* * * * *